(12) United States Patent
Peterson et al.

(10) Patent No.: US 6,972,245 B2
(45) Date of Patent: Dec. 6, 2005

(54) METHOD FOR CO-FABRICATING STRAINED AND RELAXED CRYSTALLINE AND POLY-CRYSTALLINE STRUCTURES

(75) Inventors: Jeffrey J. Peterson, Austin, TX (US); Charles E. Hunt, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 219 days.

(21) Appl. No.: 10/439,748

(22) Filed: May 15, 2003

(65) Prior Publication Data

US 2003/0219937 A1 Nov. 27, 2003

Related U.S. Application Data

(60) Provisional application No. 60/380,598, filed on May 15, 2002.

(51) Int. Cl.$^7$ ............................................. H01L 21/20

(52) U.S. Cl. ........................ 438/478; 438/933; 438/938

(58) Field of Search ................................. 438/478, 482, 438/483, 933, 938, 479, 481

(56) References Cited

U.S. PATENT DOCUMENTS

| | | | | |
|---|---|---|---|---|
| 5,961,877 | A | * 10/1999 | Robinson et al. | ........... 252/79.2 |
| 5,989,947 | A | 11/1999 | Dilger et al. | ................ 438/172 |
| 6,184,144 | B1 | * 2/2001 | Lo | .............................. 438/703 |
| 6,281,097 | B1 | 8/2001 | Aoyama | ...................... 438/478 |
| 6,350,993 | B1 | 2/2002 | Chu et al. | ...................... 257/19 |
| 6,403,975 | B1 | 6/2002 | Brunner et al. | ................ 257/15 |
| 2002/0168864 | A1 | 11/2002 | Zhiyuan et al. | ............. 438/725 |
| 2002/0197803 | A1 | 12/2002 | Leitz et al. | ................. 438/285 |
| 2003/0052406 | A1 | 3/2003 | Lochtefeld et al. | ......... 257/717 |
| 2005/0048778 | A1 | * 3/2005 | Bedell et al. | ................ 438/689 |

* cited by examiner

*Primary Examiner*—Brad Smith
(74) *Attorney, Agent, or Firm*—Park, Vaughan & Fleming LLP; Edward J. Grundler

(57) ABSTRACT

One embodiment of the present invention provides a system for co-fabricating strained and relaxed crystalline, poly-crystalline, and amorphous structures in an integrated circuit device using common fabrication steps. The system operates by first receiving a substrate. The system then fabricates multiple layers on this substrate. A layer within these multiple layers includes both strained structures and relaxed structures. These strained structures and relaxed structures are fabricated simultaneously using common fabrication steps.

13 Claims, 6 Drawing Sheets

METHOD FOR CO-FABRICATING STRAINED AND RELAXED CRYSTALLINE AND POLY-CRYSTALLINE STRUCTURES

RELATED APPLICATION

This application hereby claims priority under 35 U.S.C. §119 to U.S. Provisional Patent Application No. 60/380,598, filed on 15 May 2002, entitled "Methods of Co-Fabricating Strained and Relaxed Structures," by inventors Jeffery J. Peterson and Charles E. Hunt.

GOVERNMENT LICENSE RIGHTS

This invention was made with United States Government support under Grant Nos. N00014-93-C-0114 and N00014-96-C-0219 awarded by the Office of Naval Research. The United States Government has certain rights in the invention.

BACKGROUND

1. Field of the Invention

The present invention relates to the process of fabricating integrated devices. More specifically, the present invention relates to a method for co-fabricating strained and relaxed crystalline, poly-crystalline, and amorphous structures during integrated device fabrication.

2. Related Art

Fabrication of integrated devices (integrated circuits, discrete electronic devices, Micro ElectroMechanical Systems (MEMS), optical components, materials using silicon-germanium (SiGe) and silicon-germanium-carbon (SiGeC), and other materials and devices) typically entails growing several layers of material. A common fabrication technique produces strained or relaxed structures within the layers to alter the properties of the layers.

For example, strained and relaxed structures are used during fabrication of an integrated device in creating high-speed complementary metal-oxide semiconductor (CMOS) circuitry. Positive channel metal-oxide semiconductor (PMOS) devices with compressively strained layers (e.g. SiGe or SiGeC channels) have the desirable quality of being faster than their silicon counterparts. However, the opposite is true of compressively strained SiGe negative channel metal-oxide semiconductor (NMOS) devices; they are slower than their silicon counterparts. In order to obtain fast NMOS devices, strained Si channels are fabricated over a relaxed (e.g. SiGe or SiGeC) layer (also known as a buffer layer). The integration of both of these types of devices on a common substrate, however, requires that both strained and relaxed SiGe (or SiGeC) layers be present on that substrate. Unfortunately, current fabrication techniques do not allow the simultaneous fabrication of both strained and relaxed crystalline, poly-crystalline, and amorphous structures using common fabrication steps.

Hence, what is needed is a method for co-fabricating strained and relaxed crystalline, poly-crystalline, and amorphous structures without the problems described above.

SUMMARY

One embodiment of the present invention provides a system for co-fabricating strained and relaxed crystalline, poly-crystalline, and amorphous structures in an integrated circuit device using common fabrication steps. During operation, the system co-fabricates multiple layers on a substrate. At least one of these layers includes both strained structures and relaxed crystalline, poly-crystalline, and amorphous layers, which are fabricated simultaneously using common fabrication steps.

In a variation of this embodiment, co-fabricating multiple layers on the substrate involves first creating a strained, relaxed, poly-crystalline, or amorphous epitaxial layer with a thickness greater than, equal to, or less than a critical thickness on the substrate. Next, the system modifies areas of this relaxed epitaxial layer to provide areas for a strained epitaxial layer. This may include removing areas of the relaxed epitaxial layer. The system then creates a strained epitaxial layer with a thickness less than the critical thickness over the exposed portions of the substrate.

In a further variation, co-fabricating multiple layers on the substrate involves first providing epitaxial blocking layers on the substrate to delineate some areas and other areas. The system then forms an epitaxial layer on the substrate, wherein the epitaxial layer is a strained epitaxial layer in some areas and is a relaxed epitaxial layer in other areas. In one embodiment, small areas will be strained while large areas will be relaxed.

In a further variation, co-fabricating multiple layers on the substrate involves first forming an epitaxial layer with a thickness greater than, equal to, or less than a critical thickness on the substrate. Next, the system forms a capping layer on some or all areas of the epitaxial layer. This capping layer provides a strained layer in areas covered by the cap a relaxed layer in those areas not covered by the cap. Epitaxial blocking layers may be used as capping layers. Capping layers may lie under, in, or over the epitaxial layer.

In a further variation, co-fabricating multiple layers on the substrate involves building up a circuit by repeating a process that first forms an epitaxial layer, and then forms an epitaxial blocking layer over portions of the epitaxial layer. In one embodiment, areas where cumulative depositions of the epitaxial layer are less than a critical dimension provide a strained epitaxial layer and areas where cumulative depositions are greater than the critical dimension provide a relaxed or strained crystalline, poly-crystalline, and/or amorphous epitaxial layer.

In a further variation, co-fabricating multiple layers on the substrate involves first forming an epitaxial layer with a thickness greater than, equal to, or less than a critical thickness and then treating a selected area of the epitaxial layer to create a relaxed or strained crystalline, poly-crystalline, and/or amorphous epitaxial layer in the selected area. Treating the selected area can be accomplished using a light source, an e-beam source, a sound source, a maser, an infrared source, an ultrasonic source, another heat source, or another energy source.

In a further variation, co-fabricating multiple layers on the substrate involves first forming an epitaxial layer on the substrate, perhaps selecting areas of the epitaxial layer, and then using implantation to provide energy to relax or strain areas of the epitaxial layer.

In a further variation, co-fabricating multiple layers on the substrate involves first forming an epitaxial layer with a thickness greater than, equal to, or less than a critical thickness on the substrate and then implanting an element that can prevent relaxation during a subsequent treatment as well as create crystalline, poly-crystalline, and amorphous layers.

In a further variation, co-fabricating multiple layers on the substrate involves first forming an epitaxial layer with a thickness less than, equal to, or greater than a critical thickness on the substrate and then implanting an element into the epitaxial layer that can cause strain or relaxation during a subsequent treatment.

In a further variation, co-fabricating multiple layers on the substrate involves first modifying selected areas of the substrate and then depositing or modifying an epitaxial layer on the substrate. These modified areas produce either a strained area or a relaxed area.

In a further variation, co-fabricating multiple layers on the substrate involves first creating a crystalline, polycrystalline, or amorphous area on the substrate and then depositing or modifying an epitaxial layer on the substrate. The area provides a template for a relaxed or strained area.

In a further variation, co-fabricating multiple layers on the substrate involves first modifying a base material in selected regions of the substrate and then depositing or modifying an epitaxial layer on the substrate. The modified area produces either a strained area or a relaxed area.

In a further variation, co-fabricating multiple layers on the substrate involves first modifying a growth property of an interface with the substrate. This can be accomplished using a surfactant, a catalyzer, a material, a selective treatment, or by using another method to modify the growth property of the interface. The system then deposits or modifies an epitaxial layer on the substrate. The modified area of the substrate produces either a strained area or a relaxed area.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Etch Stop Removal of Epitaxial Layers

Figure 1A:
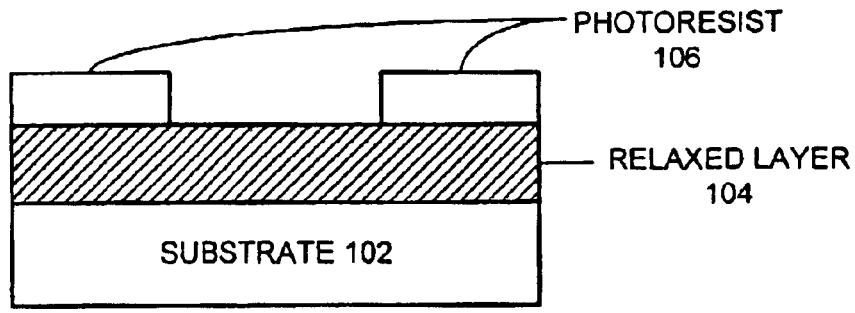
FIG. 1A illustrates a substrate with a relaxed layer in accordance with an embodiment of the present invention.

FIG. 1A illustrates a substrate 102 with a relaxed layer 104 in accordance with an embodiment of the present invention. Relaxed layer 104 is an epitaxial layer with a thickness greater than a given critical thickness that has been grown on substrate 102. The critical thickness is dependent upon the materials used for substrate 102 and relaxed layer 104. This critical thickness is known for many materials and, for example, is assumed to be 80 nm for a certain composition of SiGe on Si. Photoresist 106 is applied to relaxed layer 104 in preparation for an etching step that will etch away portions of relaxed layer 104 that are not protected. This process is a patterning process, wherein photoresist 106 patterns the relaxed layer to provide the desired elements. The etching step can include selective etching as described in U.S. Pat. No. 5,961,877 to Robinson et al.

Note that while these descriptions recite silicon, SiGe, and SiGeC, the present invention is applicable to any other material system such as InP on Si, GaAs on Si, etc. Also note that while the figures show flat layers, both conformal and non-conformal layers in varied orientations are equally likely. Note that the materials may be crystalline, polycrystalline, amorphous, etc.

Figure 1B:
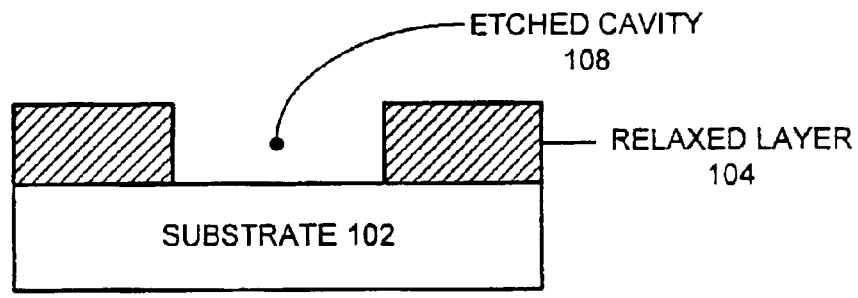
FIG. 1B illustrates an etched cavity within a relaxed layer in accordance with an embodiment of the present invention.

FIG. 1B illustrates an etched cavity within a relaxed layer in accordance with an embodiment of the present invention. After relaxed layer 104 has been etched in the areas where photoresist 106 was not applied, etched cavity 108 is left in relaxed layer 104. Photoresist 106 has been removed in preparation for growth of the next layer.

Figure 1C:
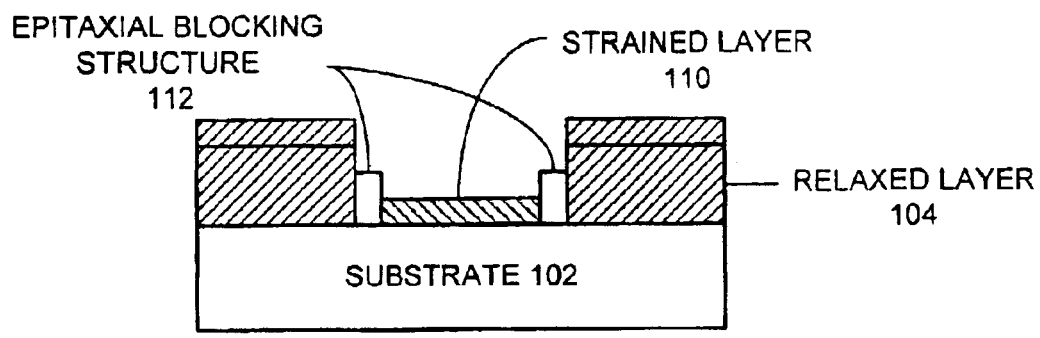
FIG. 1C illustrates growing a strained layer and a relaxed layer in accordance with an embodiment of the present invention.

FIG. 1C illustrates growing a strained layer and a relaxed layer in accordance with an embodiment of the present invention. A thin epitaxial layer has been grown over the entire surface except where epitaxial blocking structure 112 has been added. Note that strained layer 110 has been grown in etched cavity 108. Note also that relaxed layer 104 has been grown to a greater thickness but still remains relaxed since the thickness of relaxed layer 104 is still greater than the given critical thickness. Note that treatment may be selective such that layer 104 is not modified.

Strained layer 110 can be the same material as relaxed layer 104 or can be a different material. Relaxed layer 104 can be prevented from growing during the growth of strained layer 110 by using epitaxial blocking structures on the top surfaces of relaxed layer 104, or by other means.

Mechanical Properties

Figure 2A:
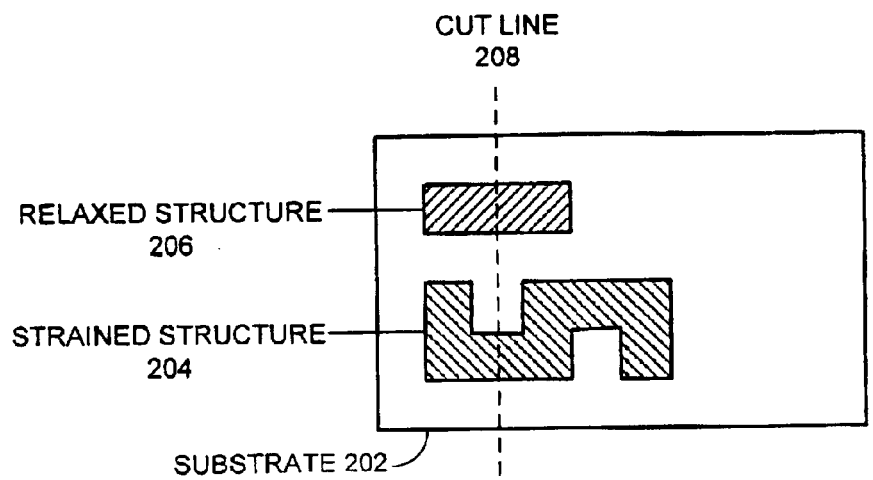
FIG. 2A illustrates a plan view of a relaxed structure and a strained structure in accordance with an embodiment of the present invention.

FIG. 2A illustrates a plan view of a relaxed structure 206 and a strained structure 204 in accordance with an embodiment of the present invention. Strained structure 204 has been constructed in a confined area within substrate 202, which prevents strained structure 204 from relaxing. Relaxed structure 206 as been grown on top of substrate 202. Relaxed structure 206 is not mechanically constrained and can relax if its thickness is greater than a given critical thickness. Cut line 208 is shown to provide a reference for FIG. 2B.

Figure 2B:
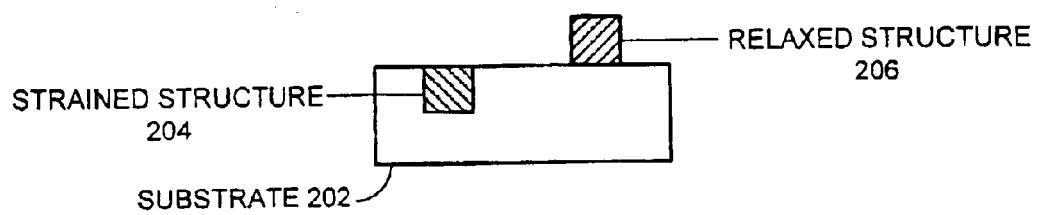
FIG. 2B illustrates a cut view of a relaxed structure and a strained structure in accordance with an embodiment of the present invention.

FIG. 2B illustrates a cut view of a relaxed structure 206 and a strained structure 204 in accordance with an embodiment of the present invention. Note that strained structure 204 is embedded within substrate 202 while relaxed structure 206 is grown on top of substrate 202.

In general, layers may be grown in a confined area, which modifies strain. Note that serpentine designs may be used to modify strain in two or more dimensions. Completely enclosed layers (e.g. quantum lines and dots) may be prevented from relaxing in three dimensions.

Mechanical properties also include area properties, capping layers, and strained caps. For area properties, the resistance of small areas to relaxation is used to create strained regions of small area, while regions of large area become relaxed (various stages of non-strain). Epitaxial growth is done in a single step using epitaxial blocks to define the areas of each region.

Capping layers can increase the critical thickness substantially. In this method, a layer with a layer thickness greater than the critical thickness but less than a critical thickness with capping is deposited over the entire substrate. Capping layers are then added to those structures that will be strained while other areas become relaxed. Epitaxial blocks may be used.

When using strained caps, capping layers of different lattice dimension are used to increase or decrease the critical thickness with capping. When the critical thickness with capping is decreased, the layers may be forced to relax. When the critical thickness with capping is increased, layer thickness may be increased without relaxation.

Blocked Epitaxial Regrowth

Figure 3A:
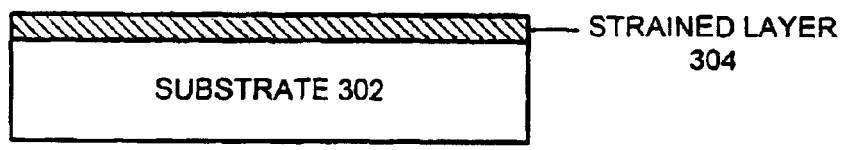
FIG. 3A illustrates a substrate with a strained layer in accordance with an embodiment of the present invention.

FIG. 3A illustrates a substrate 302 with a strained layer 304 in accordance with an embodiment of the present invention. Strained layer 304 has been grown on substrate 302 and has a thickness less than a critical thickness, which causes the strained layer 304 to be strained.

Figure 3B:
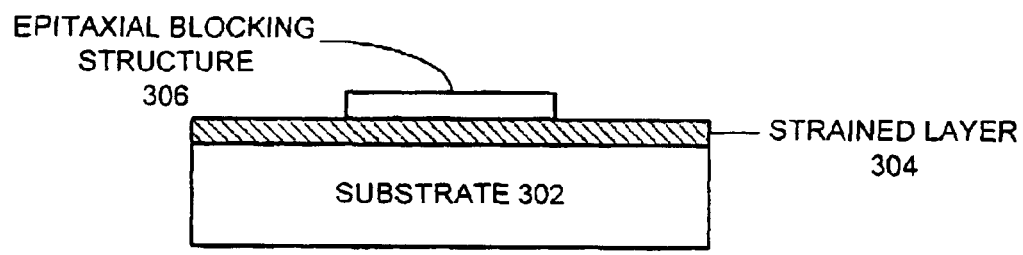
FIG. 3B illustrates an epitaxial blocking structure on a strained layer in accordance with an embodiment of the present invention.

FIG. 3B illustrates an epitaxial blocking structure 306 on a strained layer 304 in accordance with an embodiment of the present invention. Epitaxial blocking structure 306 has been applied to areas of strained layer 304 that are to remain strained during the step described in conjunction with FIG. 3C.

Figure 3C:
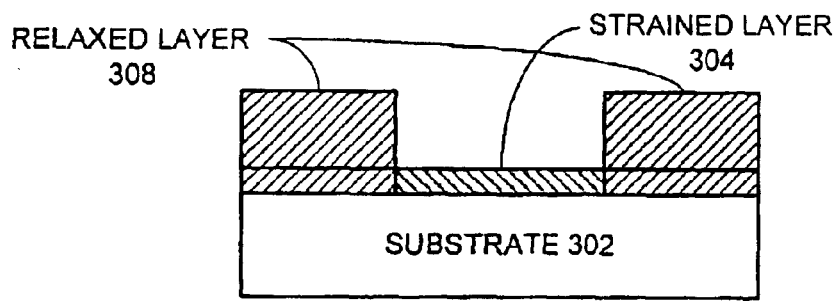
FIG. 3C illustrates relaxed layers and a strained layer on a substrate in accordance with an embodiment of the present invention.

FIG. 3C illustrates relaxed layers 308 and a strained layer 304 on a substrate in accordance with an embodiment of the present invention. After applying epitaxial blocking structure 306, epitaxial growth of the exposed areas of strained layer 304 is continued until the thickness of these layers is greater than the critical thickness. These areas then relax leaving relaxed layer 308. Epitaxial blocking structure 306 is then removed.

By combining this method with the method described below in conjunction with FIG. 7, it is possible to follow the blocking step with a blanket deposition (which also covers the epitaxial blocking or alternate substrates), thereby co-fabricating wholly, or partially strained structures in parallel with amorphous, poly-crystalline, or differently strained layers. This may be done in a single growth step.

Thermal Annealing

Figure 4A:
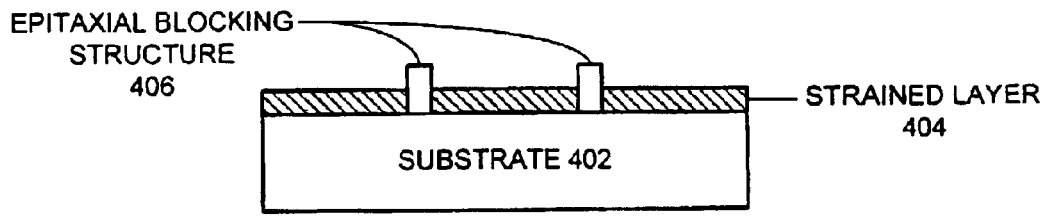
FIG. 4A illustrates a strained layer on a substrate in accordance with an embodiment of the present invention.

FIG. 4A illustrates a strained layer 404 on a substrate 402 in accordance with an embodiment of the present invention. Epitaxial blocking structures 406 have been included to isolate portions of strained layer 404.

Figure 4B:
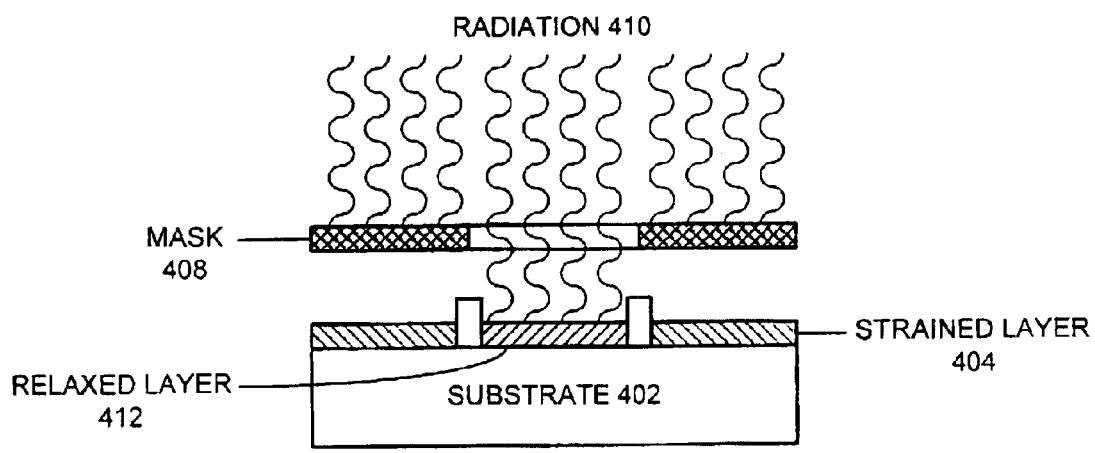
FIG. 4B illustrates using radiation to relax a strained layer in accordance with an embodiment of the present invention.

FIG. 4B illustrates using radiation 410 to relax a strained layer 404 in accordance with an embodiment of the present invention. Radiation 410 is applied to strained layer 404 through mask 408. Mask 408 selectively blocks some of radiation 410 while allowing radiation 410 to reach the center portion of strained layer 404. The thermal effects of radiation 410 causes the center portion of strained layer 404 to relax becoming relaxed layer 412. Note that it is also possible to scan radiation 410 over selected portions of strained layer 404 rather than using mask 408. Radiation 410 can be radiation from a light source, an ebeam source, a sound source, a maser, and infrared source, an ultrasonic source, or any energy source that creates thermal effects within strained layer 404. Note that masking may be by other means.

Post Treatment

Figure 5:
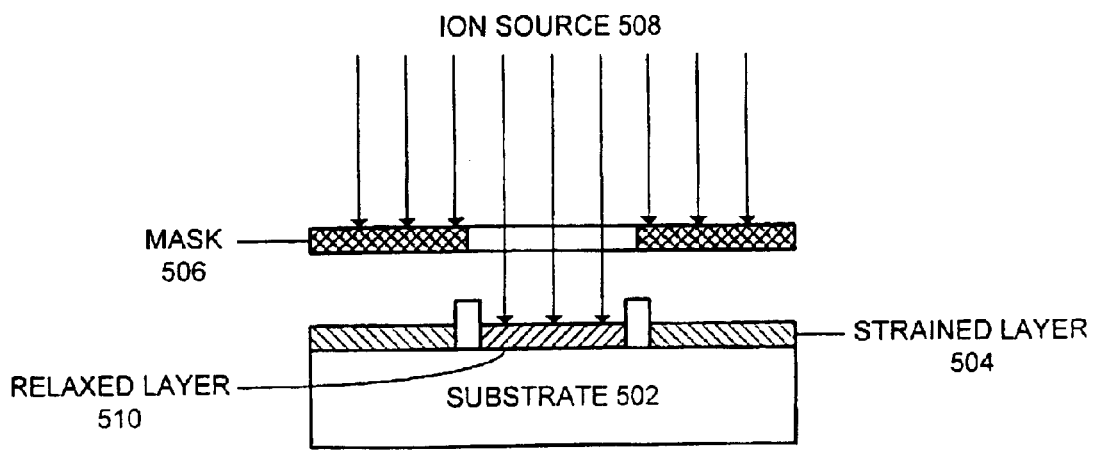
FIG. 5 illustrates using ion implantation to provide relaxation energy in accordance with an embodiment of the present invention.

FIG. 5 illustrates using ion implantation to provide relaxation energy in accordance with an embodiment of the present invention. This method begins with a system similar to that shown in FIG. 4A. Strained layer 504 is grown on substrate 502. The relaxation energy is provided from ion source 508 through mask 506. Mask 506 allows ion source 508 to provide relaxation energy to the center area of strained layer 504. This relaxation energy causes the center portion of strained layer 504 to relax becoming relaxed layer 510.

Post Growth Implantation

Figure 6A:
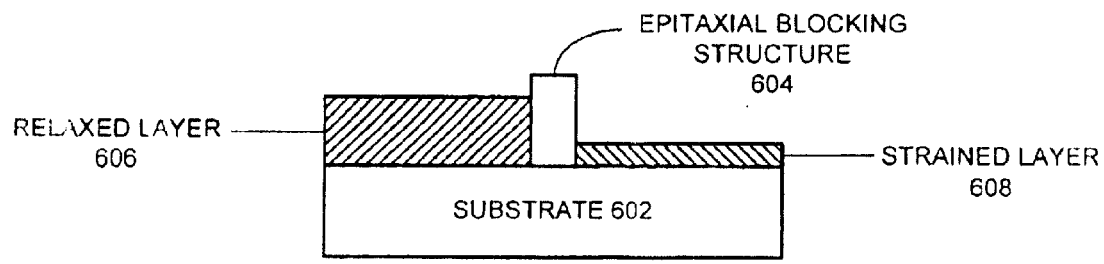
FIG. 6A illustrates a relaxed layer and a strained layer on a substrate in accordance with an embodiment of the present invention.

FIG. 6A illustrates a relaxed layer 606 and a strained layer 608 on a substrate 602 in accordance with an embodiment of the present invention. Epitaxial blocking structure 604 is used to separate relaxed layer 606 and strained layer 608. In this method, different sized ions are implanted within the various layers to either cause relaxation or to cause strain.

Figure 6B:
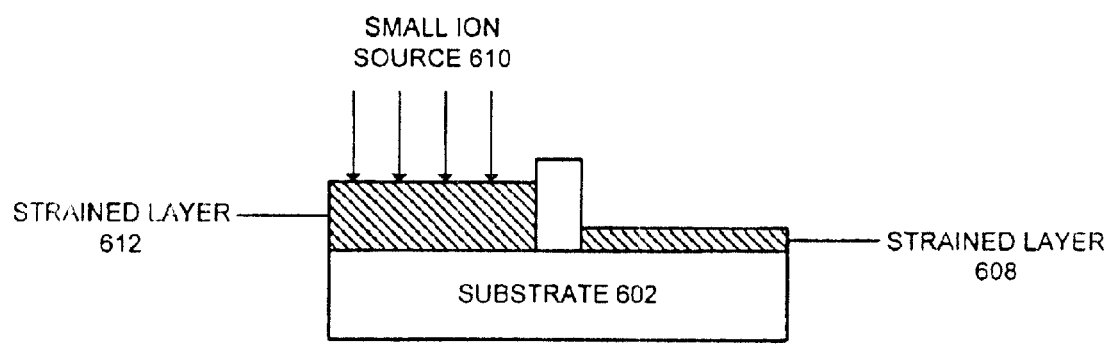
FIG. 6B illustrates implanting small ions to cause a relaxed layer to become strained in accordance with an embodiment of the present invention.

FIG. 6B illustrates implanting small ions to cause a relaxed layer 606 to become strained layer 612 in accordance with an embodiment of the present invention. Small ion source 610 implants small ions (i.e. B or C) into relaxed layer 606. These small ions cause relaxed layer 606 to become strained layer 612.

Figure 6C:
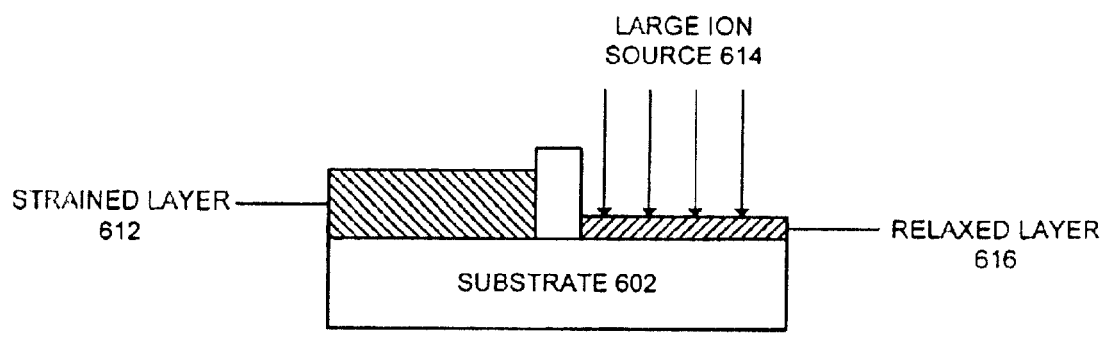
FIG. 6C illustrates implanting large ions to cause a strained layer to become relaxed in accordance with an embodiment of the present invention.

FIG. 6C illustrates implanting large ions to cause a strained layer 608 to become relaxed layer 616 in accordance with an embodiment of the present invention. Large ion source 614 implants large ions (i.e. Ge, or In) into strained layer 608. These large ions cause strained layer 608 to become relaxed layer 616.

Substrate Modification

Figure 7A:
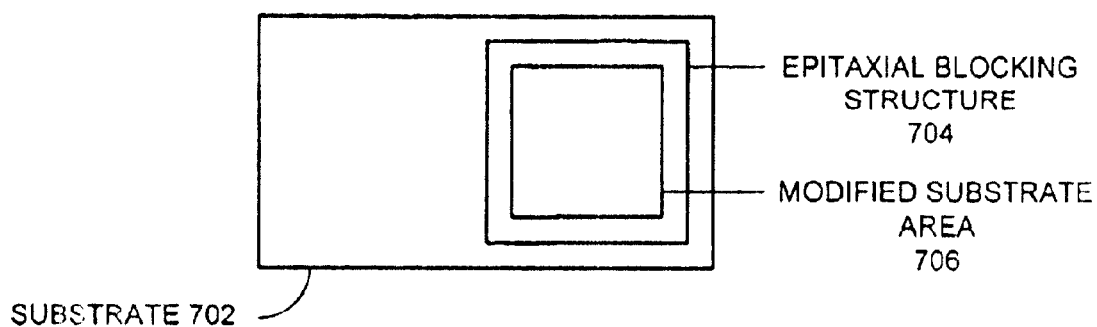
FIG. 7A illustrates a plan view of a modified substrate in accordance with an embodiment of the present invention.

FIG. 7A illustrates a plan view of a modified substrate 702 in accordance with an embodiment of the present invention. Modified substrate area 706 is created using any of several methods. Epitaxial blocking structure 704 is used to define modified substrate area 706. The method used to modify the modified substrate area 706 include: base material modification, amorphousation, interface properties, and growth properties.

Base material modification causes the base material in certain areas to be modified before deposition to create a template that will produce a relaxed or a strained area. For example, Boron implantation followed by an annealing of the base material causes reduced base material lattice dimensions leading to a strained area.

Amorphousation causes the base material in certain areas to become amorphous before deposition to create a template which will produce relaxed or amorphous layers in the treated areas.

When using interface properties, the base material in certain areas is modified in selected regions to produce relaxed or strained areas. An example of this technique may use an implanted species to affect selected areas through autodoping.

Using growth properties provides modification of interface, substrate, surfactants, catalyzers, etc. These modifications are made in selected regions to produce relaxed or strained areas. An example of this technique includes selective deposition of either surfactant or interfering species to affect layer deposition.

Figure 7B:
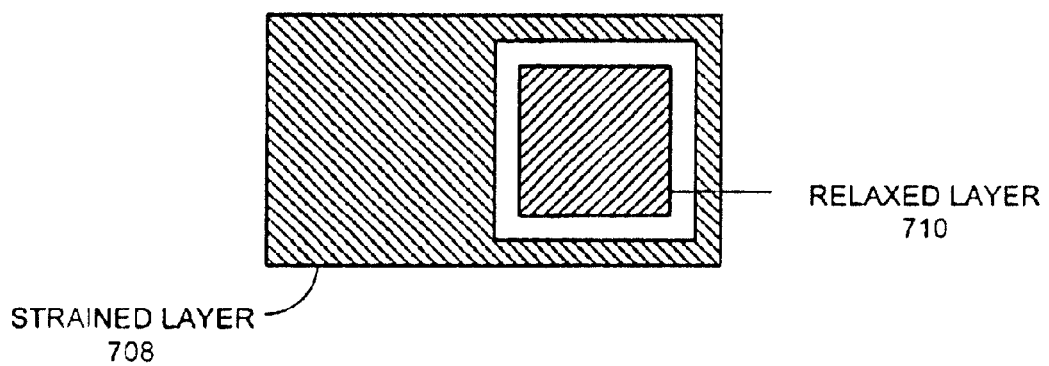
FIG. 7B illustrates growing strained and relaxed layers on a modified substrate in accordance with an embodiment of the present invention.

FIG. 7B illustrates growing strained and relaxed layers on a modified substrate in accordance with an embodiment of the present invention. Strained layer 708 has been grown on the unmodified portion of substrate 702, while relaxed layer 710 has been grown on modified substrate area 706. Note that the strained and relaxed areas grown on substrate 702 can be reversed from that shown depending on the substrate modification used and the thickness and material used to grow the epitaxial layer.

Note that the techniques described herein work equally well for parallel and serial fabrication. Note also that the expression "differently strained" refers to any change in strain, such as compressive not equal to compressive, compressive not equal to tensile, tensile not equal to relaxed. Relaxed layers may have various amounts of relaxation and strains.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for co-fabricating strained and relaxed crystalline, poly-crystalline, and amorphous structures in an integrated circuit device using common fabrication steps, comprising:

receiving a substrate; and fabricating a plurality of layers on the substrate, wherein a layer within the plurality of layers includes one or more of a strained structure and a relaxed structure and wherein the strained structure and the relaxed structure are fabricated simultaneously using common fabrication steps.

2. The method of claim 1, wherein fabricating the plurality of layers on the substrate involves:

forming a first layer with a thickness greater than, equal to, or less than a critical thickness on the substrate, wherein the first layer is a relaxed or strained layer;

treating areas of the first layer to provide areas for a subsequent layer; and forming a second layer, wherein the second layer is a layer of different strain.

3. The method of claim 1, wherein fabricating the plurality of layers on the substrate involves:

providing blocking layers on the substrate to delineate some areas and other areas; and forming a layer on the substrate, wherein the layer is a strained layer in some areas and wherein the layer is a layer of different strain in other areas.

4. The method of claim 1, wherein fabricating the plurality of layers on the substrate involves:

forming a layer with a thickness greater than, equal to, or less than a critical thickness on the substrate;

providing a blocking layer on selected areas of the layer; and forming a capping layer on selected areas of the layer, wherein the capping layer provides a layer with a different level of strain than other layers.

5. The method of claim 1, wherein fabricating the plurality of layers on the substrate involves:

building up a circuit by repeating a process of:
 forming a layer, and
 providing a blocking layer;

wherein areas where cumulative depositions that are less than, equal to, or greater than a critical dimension provide a strained or non-strained layer, and areas where cumulative depositions are greater than, equal to, or less than the critical dimension provide a layer of different strain.

6. The method of claim 1, wherein fabricating the plurality of layers on the substrate involves:

forming a layer with a thickness less than, equal to, or greater than a critical thickness; and treating a selected area of the layer to create a relaxed layer in the selected area, wherein treating the selected area can be accomplished using one of a light source, an e-beam source, a sound source, a maser, an infrared source, an ultrasonic source, another heat source, and another energy source.

7. The method of claim 1, wherein fabricating the plurality of layers on the substrate involves:

forming a layer on the substrate; and using implantation to provide energy to relax selected areas of the layer.

8. The method of claim 1, wherein fabricating the plurality of layers on the substrate involves:

forming a layer with a thickness greater than, equal to, or less than a critical thickness on the substrate; and implanting an element that can modify strain after a subsequent treatment.

9. The method of claim 1, wherein fabricating the plurality of layers on the substrate involves:

forming a layer with a thickness less than, equal to, or greater than a critical thickness on the substrate; and implanting an element that can modify strain after a subsequent treatment.

10. The method of claim 1, wherein fabricating the plurality of layers on the substrate involves:

modifying selected areas of the substrate; and forming a layer on the substrate, wherein modified areas produce areas of different strain.

11. The method of claim 1, wherein fabricating the plurality of layers on the substrate involves:
   creating a modified area on the substrate; and
   forming a layer on the substrate, wherein the amorphous area provides a template for an area of different strain.

12. The method of claim 1, wherein fabricating the plurality of layers on the substrate involves:
   modifying a base material in selected regions of the substrate; and
   forming a layer on the substrate, wherein a modified area produces an area of different strain.

13. The method of claim 1, wherein fabricating the plurality of layers on the substrate involves:
   modifying a growth property of an interface with the substrate, wherein modifying the growth property includes one of using a surfactant, using a catalyzer material, using selective treatment, and using another method to modify the growth property; and
   forming a layer on the substrate, wherein a modified area produces areas of different strain.

* * * * *